United States Patent
Youn et al.

(10) Patent No.: US 9,236,866 B2
(45) Date of Patent: Jan. 12, 2016

(54) CIRCUIT FOR DRIVING GATE OF POWER MOS TRANSISTOR

(71) Applicant: SAMSUNG ELECTRONICS CO., LTD., Suwon-si, Gyeonggi-do (KR)

(72) Inventors: Hyo-Sang Youn, Hwaseong-si (KR); Woo-Seok Kim, Seongnam-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 349 days.

(21) Appl. No.: 13/934,530

(22) Filed: Jul. 3, 2013

(65) Prior Publication Data

US 2014/0015501 A1    Jan. 16, 2014

(30) Foreign Application Priority Data

Jul. 10, 2012    (KR) .................. 10-2012-0074931

(51) Int. Cl.

| H03B 1/00 | (2006.01) |
|---|---|
| H03K 3/00 | (2006.01) |
| H03K 19/0175 | (2006.01) |
| H02M 3/158 | (2006.01) |
| H02M 3/155 | (2006.01) |

(52) U.S. Cl.
CPC ....... *H03K 19/017509* (2013.01); *H02M 3/158* (2013.01); *H02M 3/155* (2013.01)

(58) Field of Classification Search
CPC .................. H03K 19/017509; H02M 3/158
USPC ............ 327/108–112, 427, 434, 437, 170, 327/172–177; 323/272; 326/82, 83, 87
See application file for complete search history.

(56) References Cited

U.S. PATENT DOCUMENTS

| 6,242,942 B1* | 6/2001 | Shamarao | ............ H03K 17/164 326/27 |
|---|---|---|---|
| 6,385,060 B1* | 5/2002 | Basso | ...................... H02M 1/36 363/21.07 |
| 6,492,846 B1* | 12/2002 | Taguchi | ......... H03K 19/018585 326/27 |
| 6,924,669 B2* | 8/2005 | Itoh | .................. H03K 19/00361 326/27 |
| 7,449,868 B2 | 11/2008 | Elbanhawy | |
| 7,812,647 B2 | 10/2010 | Williams | |
| 8,040,157 B2* | 10/2011 | Farwell | .............. H03K 19/0033 327/170 |
| 2001/0038303 A1* | 11/2001 | Nomura | ........... H03K 19/01728 327/112 |
| 2006/0186854 A1 | 8/2006 | Ho et al. | |

(Continued)

FOREIGN PATENT DOCUMENTS

| JP | 2008-022451 | 1/2008 |
|---|---|---|
| JP | 2009-124052 | 6/2009 |
| KR | 1020090030646 | 3/2009 |

*Primary Examiner* — Lincoln Donovan
*Assistant Examiner* — Thomas Skibinski
(74) *Attorney, Agent, or Firm* — F. Chau & Associates, LLC

(57) ABSTRACT

A circuit for driving a gate of a power MOS transistor includes an adaptive pull-up unit and an adaptive pull-down unit. The adaptive pull-up unit is connected between a first power source voltage and the gate of the power MOS transistor. The adaptive pull-up unit maximizes pull-up current driving ability. The adaptive pull-down unit is connected between a second power source voltage and the gate of the power MOS transistor. The adaptive pull-down unit maximizes pull-down current driving ability.

20 Claims, 6 Drawing Sheets

(56) References Cited

U.S. PATENT DOCUMENTS

| | | |
|---|---|---|
| 2007/0080738 A1 | 4/2007 | Tai |
| 2007/0187217 A1 | 8/2007 | Tai |
| 2008/0054984 A1 | 3/2008 | Lee |
| 2009/0052096 A1 | 2/2009 | Takahashi et al. |
| 2009/0251117 A1* | 10/2009 | Pigott ................ H02M 3/1584 323/272 |
| 2015/0116006 A1* | 4/2015 | Ferianz ................ H03K 17/04 327/109 |

* cited by examiner

CIRCUIT FOR DRIVING GATE OF POWER MOS TRANSISTOR

CROSS-REFERENCE TO RELATED APPLICATION

This application claims priority under 35 USC §119 to Korean Patent Application No. 10-2012-0074931, filed on Jul. 10, 2012 in the Korean Intellectual Property Office (KIPO), the disclosure of which is incorporated by reference in its entirety herein.

BACKGROUND

1. Technical Field

Example embodiments of the inventive concept relate generally to driving circuits, and more particularly to a circuit for driving a gate of a power MOS transistor.

2. Discussion of Related Art

Devices that perform wireless data communication, such as a laptop computer, a mobile phone or a tablet PC, may include a DC-DC converter and a Power Management Integrated Circuit (PMIC). A DC-DC converter is an electronic circuit which converts a source of direct current from one voltage level to another voltage level. A PMIC is an integrated circuit for managing power requirements. A switching frequency of the DC-DC converter applied to the PMIC may be increased to enable components to be lightweight and to increase battery life.

However, when the switching frequency is increased, a higher Electromagnetic Interference (EMI) noise is generated, which interferes with wireless data communication.

SUMMARY

At least one exemplary embodiment of the inventive concept provides a circuit for driving a gate of a power MOS transistor, which may reduce EMI noise by properly controlling a switching speed of a power switching transistor according to a transition state.

At least one exemplary embodiment of the inventive concept provides a circuit for driving a gate of a power MOS transistor, which may minimize a switching loss during a rising transition of a power transistor and which may prevent the power MOS transistor from malfunctioning due to noise during a falling transition of the power MOS transistor.

According to an exemplary embodiment of the inventive concept, a circuit for driving a gate of a power MOS transistor includes an adaptive pull-up unit and an adaptive pull-down unit. The adaptive pull-up unit is connected between a first power source voltage and the gate of the power MOS transistor. The adaptive pull-up unit maximizes pull-up current driving ability when a drain-source voltage of the power MOS transistor falls equal to or less than a threshold voltage of the power MOS transistor while a falling transition slope of the power MOS transistor is being driven in a multistage scheme by increasing the pull-up current driving ability stepwisely in response to a leading edge of a gate driving pulse. The adaptive pull-down unit is connected between a second power source voltage and the gate of the power MOS transistor. The adaptive pull-down unit maximizes pull-down current driving ability when a gate source voltage of the power MOS transistor falls equal to or less than the threshold voltage of the power MOS transistor while a rising transition slope of the power MOS transistor is being driven in a multistage scheme by increasing the pull-down current driving ability stepwisely in response to a trailing edge of the gate driving pulse.

In an embodiment, the adaptive pull-up unit may include a plurality of pull-up transistors connected in parallel between the first power source voltage and the gate of the power MOS transistor, a drain-source voltage detecting unit may detect whether a level of the drain-source voltage of the power MOS transistor falls equal to or less than the threshold voltage of the power MOS transistor, a pull-up driving signal generating unit may generate a plurality of pull-up driving signals to drive the pull-up transistors stepwisely in response to the leading edge of the gate driving pulse and a gate unit may drive a pull-up transistor of a last stage from among the pull-up transistors selectively in response to a pull-up driving signal of the last stage from among the pull-up driving signals and a detection signal from the drain source voltage detecting unit.

The drain source voltage detecting unit may include a first MOS transistor that has a gate coupled to the first power source voltage and a drain coupled to a drain of the power MOS transistor; a first current source connected between a source of the first MOS transistor and the second power source voltage; a second MOS transistor that has a gate coupled to the source of the first MOS transistor and a source coupled to the second power source voltage; a second current source connected between the first power source voltage and a drain of the second MOS transistor; and a CMOS inverter that outputs a drain voltage of the second MOS transistor as the detection signal of a CMOS level.

The first and second MOS transistors may include Lateral Double Diffuse (LD) MOS transistors that have a threshold voltage equal to a threshold voltage of the power MOS transistor.

In an embodiment, the adaptive pull-down unit may include a plurality of pull-down transistors connected in parallel between the second power source voltage and the gate of the power MOS transistor; a gate source voltage detecting unit configured to detect whether a level of the gate-source voltage of the power MOS transistor is between a Miller Plateau voltage level of the power MOS transistor and a level of the threshold voltage; a pull-down driving signal generating unit configured to generate a plurality of pull-down driving signals for driving the pull-down transistors step by step in response to the trailing edge of the gate driving pulse; and a gate unit configured to mask a pull-down driving signal of a last stage among the pull-down driving signals such that the pull-down driving signal is prevented from being applied to a pull-down transistor of the last stage among the pull-down transistors unless the gate source voltage of the power MOS transistor falls equal to or less than the threshold voltage of the power MOS transistor in response to the detection signal of the gate-source voltage detecting unit.

The gate-source voltage detecting unit may include a first voltage comparing unit configured to detect whether the gate source voltage of the power MOS transistor falls equal to or less than a first preset voltage; a second voltage comparing unit configured to detect whether the gate source voltage of the power MOS transistor falls equal to or less than the threshold voltage; and a masking signal generating unit configured to generate a masking control signal by combining outputs of the first and second voltage comparing units with each other.

The first voltage comparing unit may include a first MOS transistor that has a gate coupled to the gate of the power MOS transistor; a second MOS transistor that has a gate and a drain coupled to a source of the first MOS transistor and a source coupled to the second power source voltage; a third MOS transistor that has a gate coupled to the drain of the first MOS transistor and a source coupled to the first power source voltage; a second current source connected between a drain of the third MOS transistor and the second power source voltage; and a CMOS inverter that outputs a drain voltage of the second MOS transistor as the detection signal of a CMOS level.

The second voltage comparing unit may include a fourth MOS transistor that has a gate coupled to the gate of the power MOS transistor; a third current source connected between the first power source voltage and a drain of the fourth MOS transistor; a fifth MOS transistor that has a gate coupled to the drain of the fourth MOS transistor and a source coupled to the first power source voltage; and a fourth current source connected between a drain of the fifth MOS transistor and the second power source voltage.

The masking signal generating unit may include an XOR gate to which an output of the CMOS inverter of the first voltage detecting unit and a drain output of the fifth MOS transistor of the second voltage comparing unit are input.

The first and fourth MOS transistors may include LD MOS transistors that have a threshold voltage equal to a threshold voltage of the power MOS transistor.

According to an exemplary embodiment of the inventive concept, a circuit for driving a gate of a power MOS transistor includes a pair of pull-up transistors connected in parallel between a first power source voltage and the gate of the power MOS transistor; a pair of pull-down transistors connected in parallel between a second power source voltage and the gate of the power MOS transistor; a drain-source voltage detecting unit configured to detect whether a level of a drain source voltage of the power MOS transistor falls equal to or less than the threshold voltage of the power MOS transistor; a gate-source voltage detecting unit configured to detect whether a level of a gate source voltage of the power MOS transistor is between a Miller Plateau voltage level of the power MOS transistor and a level of the threshold voltage; a driving signal generating unit configured to generate a pair of pull-up and pull-down driving signals to drive the pair of pull-up and pull-down transistors step by step according to a gate driving pulse; a pull-up gate unit configured to drive one of the pair of pull-up transistors, which is turned on later than a remaining pull-up transistor, selectively in response to one of the pair of pull-up driving signals activated later than a remaining pull-up driving signal and a detection signal of the drain source voltage detecting unit; and a pull-down gate unit configured to mask one of the pair of the pull-down driving signals activated later than a remaining pull-down driving signal such that the pull-down driving signal is prevented from being applied to one of the pair of the pull-down transistors turned on later than a remaining pull-down transistor unless the gate source voltage of the power MOS transistor falls equal to or less than the threshold voltage of the power MOS transistor in response to a detection signal of the gate source voltage detecting unit.

In an embodiment, the driving signal generating unit may include an input latch configured to generate a first output and a second output, in which the first output is subject to a falling transition after the second output is primarily subject to the falling transition and the pull-down transistors are turned off in response to a rising transition of the gate driving pulse, and the second output is subject to the rising transition after the first output is primarily subject to the rising transition and the pull-up transistors are turned off in response to the falling transition of the gate driving pulse; a pull-up latch configured to generate a first output and a second output, in which the second output is subject to the falling transition prior to the first output when the falling transition occurs and the first output is subject to the rising transition prior to the second output when the rising transition occurs in response to the first output of the input latch; and a pull-down latch configured to generate a first output and a second output, in which the second output is subject to the falling transition prior to the first output when the falling transition occurs and the first output is subject to the rising transition prior to the second output when the rising transition occurs in response to the second output of the input latch. The second output of the pull-up latch may be provided as a gate driving signal for one of the pair of the pull-up transistors, the first output of the pull-up latch may be provided through the pull-up gate unit as a gate driving signal for remaining one of the pull-up transistors, the first output of the pull-down latch may be provided as a gate driving signal for one of the pair of the pull-down transistors and the second output of the pull-down latch is provided as a gate driving signal for remaining one of the pull-down transistors.

The pull-up gate unit may include an OR gate, and the pull-down gate unit may include an AND gate.

According to an exemplary embodiment of the inventive concept, a DC-DC converter includes a power metal oxide semiconductor MOS transistor. The converter includes a pair of pull-up transistors connected in parallel between a first power source voltage and a gate of the power MOS transistor; a pair of pull-down transistors connected in parallel between a second power source voltage and the gate of the power MOS transistor; a drain-source voltage detecting unit configured to detect whether a level of a drain source voltage of the power MOS transistor falls equal to or less than the threshold voltage of the power MOS transistor; a gate-source voltage detecting unit configured to detect whether a level of a gate source voltage of the power MOS transistor is between a Miller Plateau voltage level of the power MOS transistor and a level of the threshold voltage; a circuit configured to provide first though fourth signals according to a gate driving pulse; a first logic gate configured to receive an output of the drain-source voltage detecting unit and the first signal as input and provide an output to a gate of one of the pull-up transistors; a first buffer configured to provide the second signal to a gate of the other pull-up transistor; a second buffer configured to provide the third signal to a gate of one of the pull-down transistors; and a second logic gate configured to receive an output of the gate-source voltage detecting unit and the fourth signal as input and provide and output to a gate of the other pull-down transistor.

In an embodiment, the DC-DC converter may include a first capacitor connected between a DC input voltage and the second power source voltage; an inductor connected between the first capacitor and a drain of the power MOS transistor; a diode connected between the inductor and the drain of the power MOS transistor; and a second capacitor connected between the diode and the second power source voltage, where an output node between the diode and the second capacitor outputs a DC output voltage.

In an embodiment, the first signal may be provided to a last one of the pull-up transistors, and the fourth signal may be provided to a last one of the pull-down transistors.

In an embodiment, the first logic gate may be an OR gate and the second logic gate may be an AND gate.

In an embodiment, the circuit may include a first OR gate configured to receive a signal based on the gate driving pulse; a second OR gate configured to receive an output of the first OR gate and provide an output to the first logic gate; and a first AND gate configured to receive an output of the first OR gate and provide an output to the first buffer.

In an embodiment, the circuit may further include a second AND gate configured to receive the signal based on the gate driving pulse; a third OR gate configured to receive an output of the second AND gate and providing an output to the second buffer; and a third AND gate configured to receive an output of the second AND gate and provide an output to the second logic gate.

In an embodiment, an output of the second OR gate may be provided to an input of the first AND gate, an output of the first AND gate may be provided to an input of the second OR gate, where an output of the third OR gate may be provided to an input of the third AND gate, and an output of the third AND gate may be provided to an input of the third OR gate.

As described above, a circuit for driving the gate of the power MOS transistor according to at least one embodiment of the inventive concept can adaptively control the slopes in rising and falling transitions in response to the drain source voltage and the gate source voltage of the power MOS transistor, so that the circuit can suppress EMI and prevent the malfunction caused by the noise upon turn-off.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
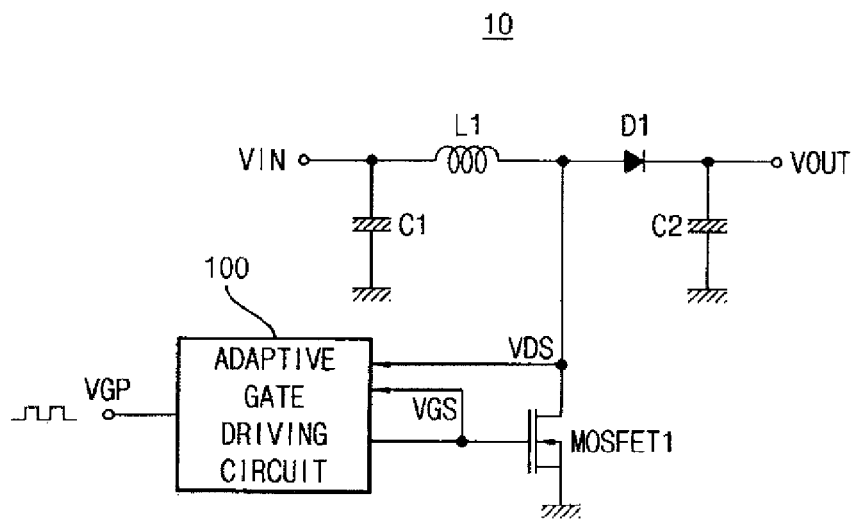
FIG. 1 is a circuit diagram showing a DC-DC converter according to an exemplary embodiment of the inventive concept.

The inventive concept will be described more fully with reference to the accompanying drawings, in which exemplary embodiments thereof are shown. This inventive concept may, however, be embodied in many different forms and should not be construed as limited to the embodiments set forth herein. Like reference numerals refer to like elements throughout this application.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

FIG. 1 is a circuit diagram showing a DC-DC converter according to an exemplary embodiment of the inventive concept.

In the DC-DC converter 10, an inductor L1 is charged by an input direct current voltage Vin when a power MOS transistor MOSFET1 is turned on, and an output direct current voltage Vout is generated by charging capacitor C2 by applying a voltage charged in a capacitor C1 and the inductor L1 through a diode D1 when a power MOS transistor MOSFET1 is turned off.

An adaptive gate driving circuit 100 allows the power MOS transistor MOSFET1 to be switched at a high speed by using a gate driving pulse of a high frequency in response to a drain source voltage VDS and a gate source voltage VGS of the power MOS transistor MOSFET1.

Thus, if the switching frequency of the DC-DC converter 10 in increased, a size of the inductor may be reduced so that an entire size of a product may be reduced.

Therefore, a portable apparatus, such as a smart phone or a tablet PC, can be manufactured in a light and slim structure with a reduced size.

However, if the switching frequency is increased, the EMI noise is increased, so that the efficiency is decreased due to switching loss.

The adaptive gate driving circuit 100 according to an exemplary embodiment of the inventive concept detects the drain source voltage and the gate source voltage of the power MOS transistor MOSFET1, thereby adaptively controlling slopes of the rising and falling transitions according to voltage variation.

Figure 2:
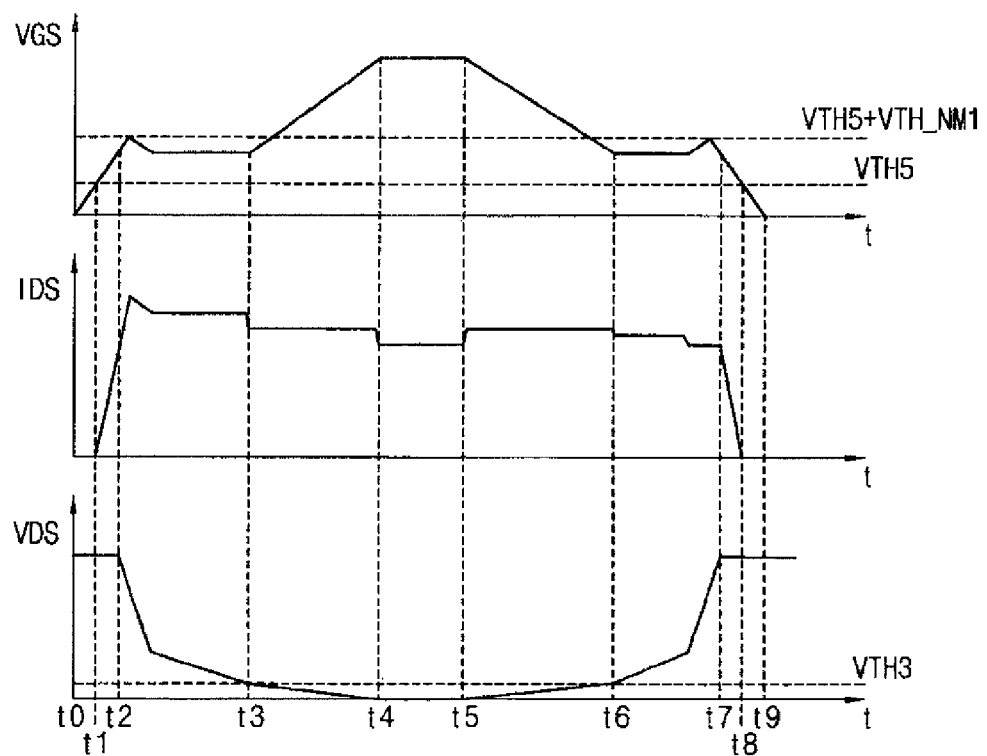
FIG. 2 is a view showing exemplary waveforms of a gate source voltage, a drain current and a drain source voltage of a power MOS transistor MOSFET1 shown in FIG. 1.

FIG. 2 is a view showing exemplary waveforms of the gate source voltage, the drain current and drain source voltage of the power MOS transistor MOSFET1 shown in FIG. 1.

Referring to FIG. 2, although the drain source voltage VDS of the power MOS transistor MOSFET1 forms a falling slope for the interval of t2~t3 when the gate voltage of the power MOS transistor MOSFET1 is in the rising transition, the gate source voltage VGS is maintained at a constant level while a parasitic capacitance CGD is being charged between the gate and the drain. This interval is called a 'Miller Plateau interval'. Likewise, the Miller plateau interval, for which the gate source voltage VGS is maintained at a constant level, is formed for the interval of t6~t7 after the falling transition of the gate voltage VGS while charges charged in the parasitic capacitor CGD are being discharged.

In order to drive a gate in a multistage slope scheme to reduce the EMI noise, the sizes of pull-up and pull-down transistors are adjusted in a multistage scheme to control the driving ability of a gate driving circuit, so that an amount of gate currents is controlled. Thus, the switching timings of the pull-up and pull-down transistors are controlled in a multistage scheme such that the current driving ability can be controlled.

The switching timings of the pull-up and pull-down transistors may be designed by adjusting an amount of gate delay. However, since a parasitic capacitance value of the power MOS transistor MOSFET1 is also proportional to the slope, it is not easy to exactly estimate the parasitic capacitance value to control the amount of gate delay. Thus, design of the switching timing may require a great deal of trial and error.

In this regard, a method according to an exemplary embodiment of the inventive concept is capable of adaptively controlling the pull-up and pull-down current driving ability of a gate driver by sensing gate and drain voltages regardless of the value of a power MOSFET parasitic capacitance.

Figure 3:
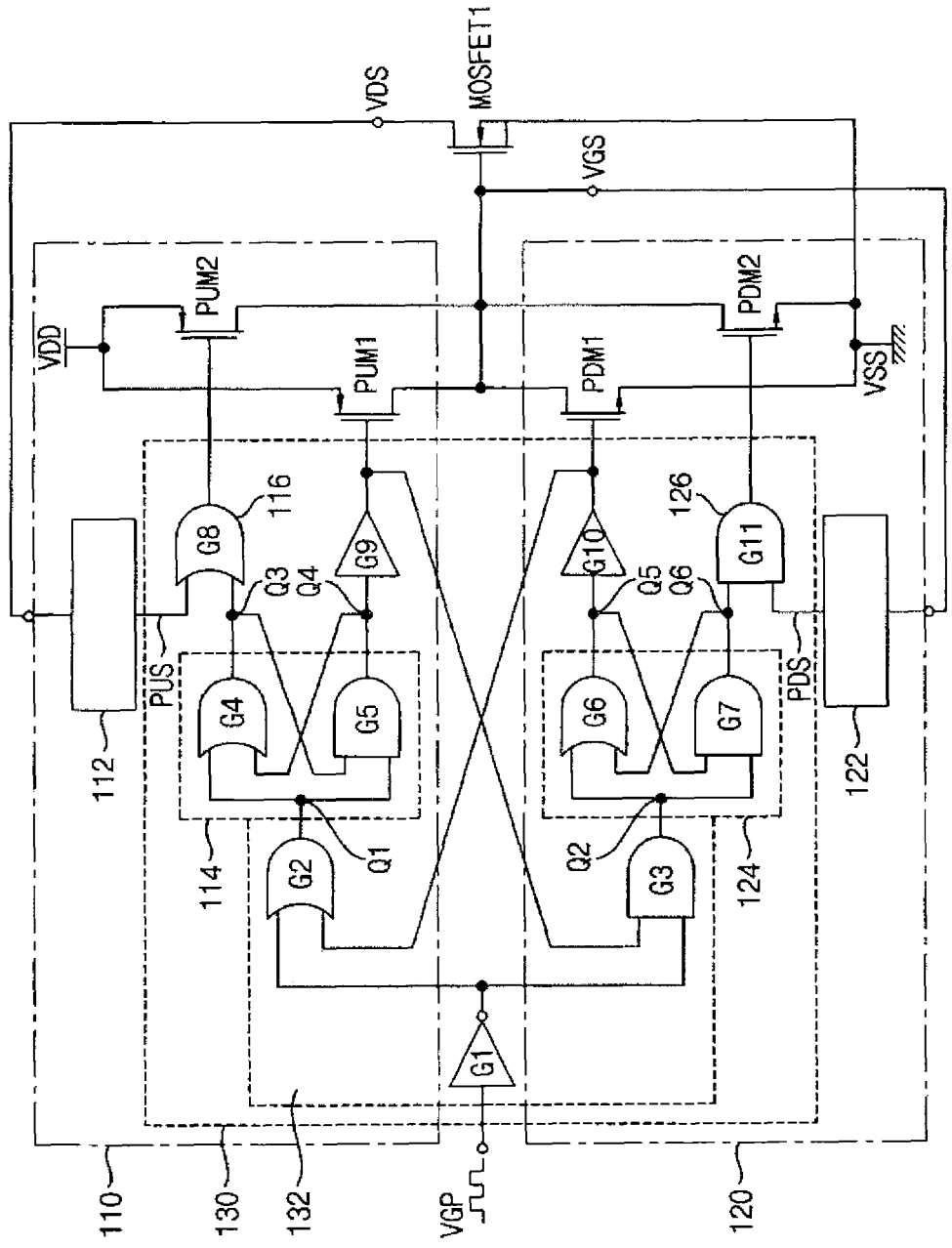
FIG. 3 is a circuit diagram showing the adaptive gate driving circuit 100 of FIG. 1 according to an exemplary embodiment of the inventive concept.

FIG. 3 is a circuit diagram showing the adaptive gate driving circuit 100 of FIG. 1 according to an exemplary embodiment of the inventive concept.

Referring to FIG. 3, the adaptive gate driving circuit 100 mainly includes a pull-up driving unit 110, a pull-down driving unit 120 and a driving signal generating unit 130.

In an exemplary embodiment of the inventive concept, a circuit for driving a gate of a power MOS transistor (e.g., MOSFET1) includes an adaptive pull-up unit (e.g., 110) and an adaptive pull-down unit (e.g., 120). The adaptive pull-up unit is connected between a first power source voltage (e.g., VDD) and the gate of the power MOS transistor. In an exemplary embodiment, the adaptive pull-up unit maximizes a pull-up current driving ability when a drain-source voltage of the power MOS transistor falls equal to or less than a threshold voltage of the power MOS transistor while a falling transition slope of the power MOS transistor is being driven in a multistage scheme by increasing the pull-up current driving capability gradually (e.g., stepwisely or in steps) in response to a leading edge of a gate driving pulse (e.g., VGP). The adaptive pull-down unit is connected between a second power source voltage (e.g., VSS) and the gate of the power MOS transistor. The adaptive pull-down unit maximizes pull-down current driving ability when a gate source voltage of the power MOS transistor falls equal to or less than the threshold voltage of the power MOS transistor while a rising transition slope of the power MOS transistor is being driven in a multistage scheme by increasing the pull-down current driving ability gradually (e.g., stepwisely or in steps) in response to a trailing edge of the gate driving pulse.

In an exemplary embodiment of the inventive concept, the adaptive pull-up unit includes a plurality of pull-up transistors (e.g., PUM1 and PUM2) connected in parallel between the first power source voltage and the gate of the power MOS transistor, a drain-source voltage detecting unit (e.g., 112) to detect whether a level of the drain-source voltage of the power MOS transistor falls equal to or less than the threshold voltage of the power MOS transistor. In an exemplary embodiment, the adaptive pull-up unit includes a pull-up driving signal generating unit that generates a plurality of pull-up driving signals to drive the pull-up transistors gradually (e.g., stepwisely or in steps) in response to the leading edge of the gate driving pulse (e.g., VGP) and a gate unit to drive a pull-up transistor of a last stage (e.g., PUM2) from among the pull-up transistors selectively in response to a pull-up driving signal of the last stage from among the pull-up driving signals and a detection signal (e.g., PUS) from the drain source voltage detecting unit.

Referring to FIG. 3, the pull-up driving unit 110 includes pull-up transistors PUM1 and PUM2, a drain source voltage detecting unit 112, a pull-up driving signal generating unit 114, and a pull-up gate unit 116.

The pull-up transistors PUM1 and PUM2 are PMOS transistors and are connected in parallel between a first power source voltage VDD and the gate of the power MOS transistor MOSFET1.

The drain source voltage detecting unit 112 generates a detection signal PUS when the drain source voltage VDS of the power MOS transistor MOSFET1 is input thereto.

The pull-up driving signal generating unit 114 generates a first output signal Q3 and a second output signal Q4 in response to a gate pulse signal VGP, respectively. The first output signal Q3 is applied to the gate of the pull-up transistor PUM2 through the pull-up gate unit 116. The second output signal Q4 is applied to the gate of the pull-up transistor PUM1 through a buffer G9.

The pull-up gate unit 116 includes an OR gate G8 and performs an OR operation with respect to the detection signal PUS output by the drain source voltage detecting unit 112 and the first output signal Q3 to output a gate driving signal to a gate of the pull-up transistor PUM2.

The pull-down driving unit 120 includes pull-down transistors PDM1 and PDM2, a gate source voltage detecting unit 122, a pull-down driving signal generating unit 124, and a pull-down gate unit 126.

The pull-down transistors PDM1 and PDM2 are NMOS transistors and connected in parallel between a second power source voltage VSS and the gate of the power MOS transistor MOSFET1. In an exemplary embodiment, the second power source voltage VSS is a ground voltage.

The gate source voltage detecting unit 122 generates a detection signal PDS when the gate source voltage VGS of the power MOS transistor MOSFET1 is input thereto.

The pull-down driving signal generating unit 124 generates a first output signal Q5 and a second output signal Q6 in response to the gate pulse signal VGP, respectively. The first output signal Q5 is applied to the gate of the pull-down transistor PDM1 through a buffer G10. The second output signal Q6 is applied to the gate of the pull-down transistor PDM2 through the pull-down gate unit 126.

The pull-down gate unit 126 includes an AND gate G11 and performs an AND operation with respect to the detection signal PDS output by the gate source voltage detecting unit 122 and the second output signal Q6 to output a gate driving signal to a gate of the pull-down transistor PDM2.

The driving signal generating unit 130 includes an input latch 132, a pull-up latch provided to the pull-up driving signal generating unit 114, and a pull-down latch provided to the pull-down driving signal generating unit 124.

The input latch 132 includes an inverter G1 for inverting the gate driving pulse VGP, an OR gate G2 and an AND gate G3. An output terminal of the OR gate G2 serves as an output terminal for a first output signal Q1 of the input latch 132, and an output terminal of the AND gate G3 serves as an output terminal for a second output signal Q2 of the input latch 132. The driving signal output to a gate of the pull-down transistor PDM1 is fed back to one input terminal of the OR gate G2, and the driving signal output to a gate of the pull-down transistor PUM1 is fed back to one input terminal of the AND gate G3.

The pull-up latch 114 includes an OR gate G4 and an AND gate G5. The first output signal Q1 of the input latch 132 is input to each input terminal of the OR gate G4 and the AND gate G5. The output signal of the AND gate G5 is fed back to one input terminal of the OR gate G4, and the output signal of the OR gate G4 is fed back to one input terminal of the AND gate G5.

The pull-down latch 124 includes an OR gate G6 and an AND gate G7. The second output signal Q2 of the input latch 132 is input to each input terminal of the OR gate G6 and the AND gate G7. The output signal of the AND gate G7 is fed back to one input terminal of the OR gate G6, and the output signal of the OR gate G6 is fed back to one input terminal of the AND gate G7.

Therefore, in the input latch 132, the second output signal Q2 is primarily subject to a falling transition in response to the rising transition of the gate driving pulse VGP and then the first output signal Q1 is subject to the falling transition after the pull-down transistor PDM1 is turned off. In addition, the first output signal Q1 is primarily subject to a rising transition in response to the falling transition of the gate driving pulse VGP and then the second output signal Q2 is subject to the rising transition after the pull-up transistor PUM1 is turned off.

In the pull-up latch 114, when the falling transition is performed in response to the first output signal Q1 output by the input latch 132, the second output signal Q4 is subject to the falling transition prior to the first output signal Q3 and the first output signal Q3 is subject to the rising transition prior to the second output signal Q4.

In the pull-down latch 124, when the falling transition is performed in response to the first output signal Q1 of the input latch 132, the second output signal Q6 is subject to the falling transition prior to the first output signal Q5 and the first output signal Q5 is subject to the rising transition prior to the second output signal Q6.

Therefore, the first output signal Q3 output by the pull-up latch 114 serves as a gate driving signal of the pull-up transistor PUM2, and the second output signal Q4 output by the pull-up latch 114 serves as a gate driving signal of the pull-up transistor PUM1. The first output signal Q5 output by the pull-up latch 124 serves as a gate driving signal of the pull-down transistor PDM1, and the second output signal Q6 output by the pull-down latch 124 serves as a gate driving signal of the pull-down transistor PDM2.

In FIG. 3, in an exemplary embodiment, the sizes of the pull-up and pull-down transistors PUM1 and PDM1 are designed to be smaller than those of the pull-up and pull-down transistors PUM2 and PDM2 to reduce the slope to diminish the EMI. In this embodiment, the charging and discharging currents of a gate drain parasitic capacitor of the power MOS transistor MOSFET1 is reduced.

Figure 4:
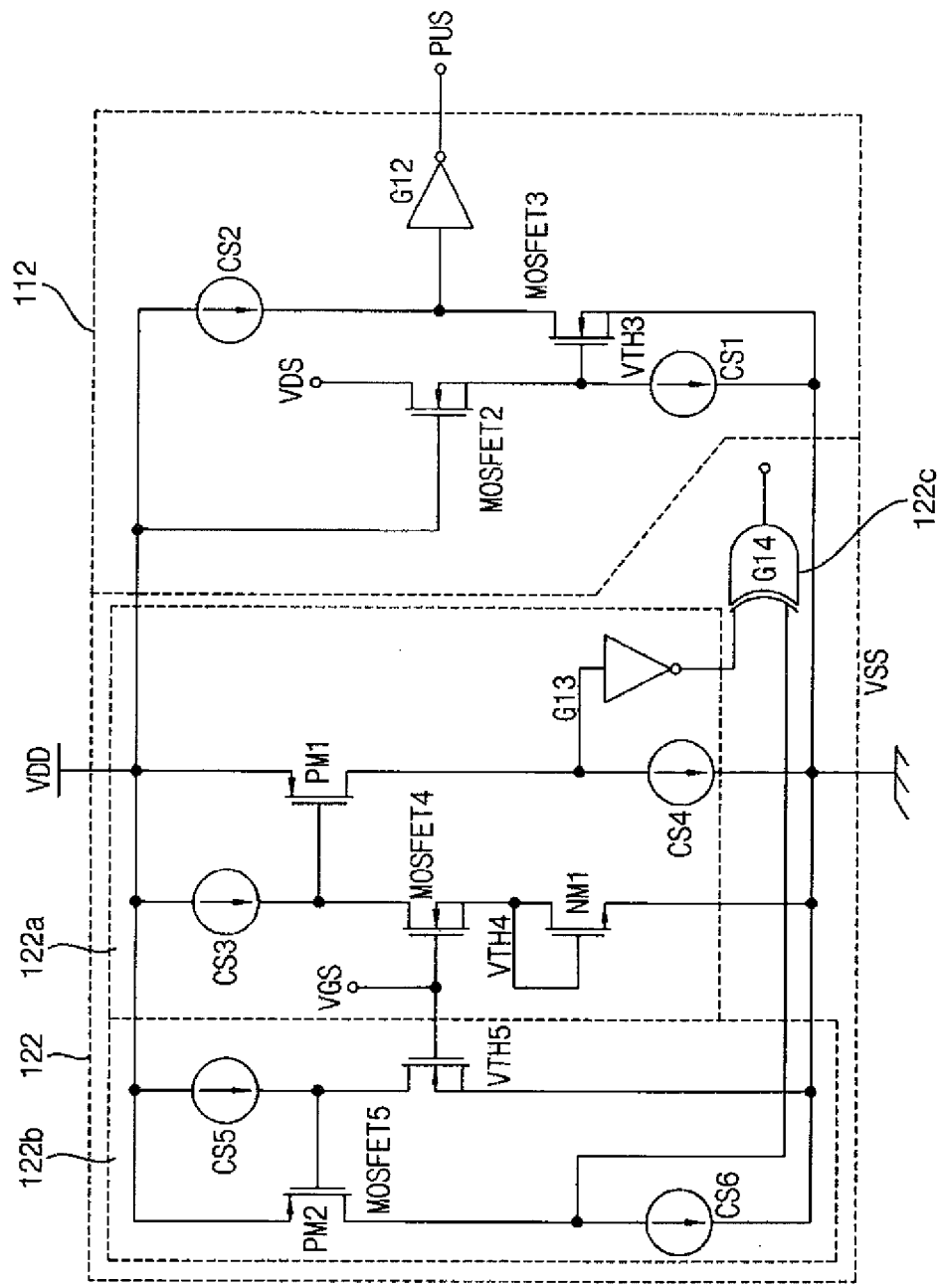
FIG. 4 is a circuit diagram showing a drain source voltage detecting unit and a gate source voltage detecting unit shown in FIG. 3 according to exemplary embodiments of the inventive concept.

FIG. 4 is a circuit diagram showing the drain source voltage detecting unit 112 and the gate source voltage detecting unit 122 shown in FIG. 3 according to exemplary embodiments of the inventive concept.

Referring to FIG. 4, the drain source voltage detecting unit 112 includes a MOS transistor MOSFET2, a MOS transistor MOSFET3, current sources CS1 and CS2, and an inverter G12. The gate of the MOS transistor MOSFET2 is connected to the first power source voltage VDD and the drain of the MOS transistor MOSFET2 is connected to the drain of the power MOS transistor MOSFET1. The gate of the MOS transistor MOSFET3 is connected to the source of the MOS transistor MOSFET2, and the source of the MOS transistor MOSFET3 is connected to the second power source voltage VSS. In an exemplary embodiment of the inventive concept, the second power source voltage is a ground voltage. The first current source CS1 is connected between the source of the power MOS transistor MOSFET2 and the second power source voltage VSS, and the second current source CS2 is connected between the drain of the MOS transistor MOSFET3 and the first power source voltage VDD. The CMOS inverter G12 outputs a drain voltage of the MOS transistor MOSFET3 as a detection signal PUS of a CMOS level.

In an exemplary embodiment of the inventive concept, the MOS transistors MOSFET2 and MOSFET3 are implemented by using Lateral Double Diffuse metal Oxide Semiconductor Field Effect Transistors (LD MOS FETs), which have a threshold voltage equal to a threshold voltage of the power MOS transistor MOSFET1.

Thus, when the drain source voltage VDS of the power MOS transistor MOSFET1 is greater than the threshold voltage VTH3 of the power MOS transistor MOSFET3 (e.g., VDS>VTH3), the MOS transistors MOSFET2 and MOSFET3 are turned on, so the input of the inverter G12 becomes a logic low state so that a logic high is output as the detection signal PUS. When VDS<VTH3, the MOS transistors MOSFET2 and MOSFET3 are turned off, so the input of the inverter G12 becomes a logic high state so that a logic low is output as the detection signal PUS.

The gate source voltage detecting unit 122 includes a first voltage comparing unit 122a, a second voltage comparing unit 122b and a masking signal generating unit 122c.

The first voltage comparing unit 122a includes a MOS transistor MOSFET4, an NMOS transistor NM1, a PMOS transistor PM1, current sources CS3 and CS4 and an inverter G13.

The gate source voltage VGS is fed back from the gate of the power MOS transistor MOSFET1 to the gate of the MOS transistor MOSFET4. The current source CS3 is connected between the first power source voltage VDD and the drain of the MOS transistor MOSFET4. The gate and drain of the NMOS transistor NM1 are coupled to the source of the MOS transistor MOSFET4, and the source of the NMOS transistor NM1 is coupled to the second power source voltage VSS. The gate of the PMOS transistor PM1 is coupled to the drain of the MOS transistor MOSFET4 and the source of the PMOS transistor PM1 is coupled to the first power source voltage VDD. The current source CS4 is connected between the drain of the transistor PM1 and the second power source voltage VSS. The CMOS inverter G13 outputs a drain voltage of the PMOS transistor PM1 as a first comparing signal having a CMOS level.

The second voltage comparing unit 122b includes a MOS transistor MOSFET5, a PMOS transistor PM2 and current sources CS5 and CS6. The gate of the MOS transistor MOSFET5 is coupled to the gate source voltage VGS fed back from the gate of the power MOS transistor MOSFET1. The current source CS5 is connected between the first power source voltage VDD and the drain of the MOS transistor MOSFET5. The gate of the PMOS transistor PM2 is coupled to the drain of the MOS transistor MOSFET5, and the source of the PMOS transistor PM2 is coupled to the first power source voltage VDD. The current source CS6 is connected between the drain of the PMOS transistor PM2 and the second power source voltage VSS. The second voltage comparing unit 122b outputs a drain voltage of the PMOS transistor PM2 as a comparing signal.

The masking signal generating unit 122c includes an XOR gate G14. The XOR gate G14 outputs a logic low when the states of the first and second comparing signals are different from each other, that is, under the condition of VTH5<VGS<VTH4+VTH_NM1. VTH5 is the threshold voltage of the MOS transistor MOSFET5, VTH4 is the threshold voltage of the MOS transistor MOSFET4, and VTH_NM1 is the threshold voltage of NMOS transistor NM1.

Since the MOS transistors MOSFET4 and MOSFET5 are turned on under the condition of VGS>VTH4+VTH_NM1, the PMOS transistors PM1 and PM2 are also turned on. Thus, although the same high state is formed at both sides, since the output of the first voltage comparing unit 122a is inverted, the outputs having mutually different states are combined in the XOR gate G14 so that the output of the XOR gate G14 becomes a logic high state.

Since the MOS transistors MOSFET4 and MOSFET5 are turned off under the condition of VGS<VTH5, the PMOS transistors PM1 and PM2 are also turned off. Thus, the same low state is formed at both sides, so the output of the XOR gate G14 becomes a logic high state.

Therefore, the detection signal PDS of the gate source voltage detecting unit 122 outputs a signal waveform that maintains the logic low only under the condition of VTH5<VGS<VTH4+VTH+NM1 and maintains the logic high under other conditions.

Figure 5:
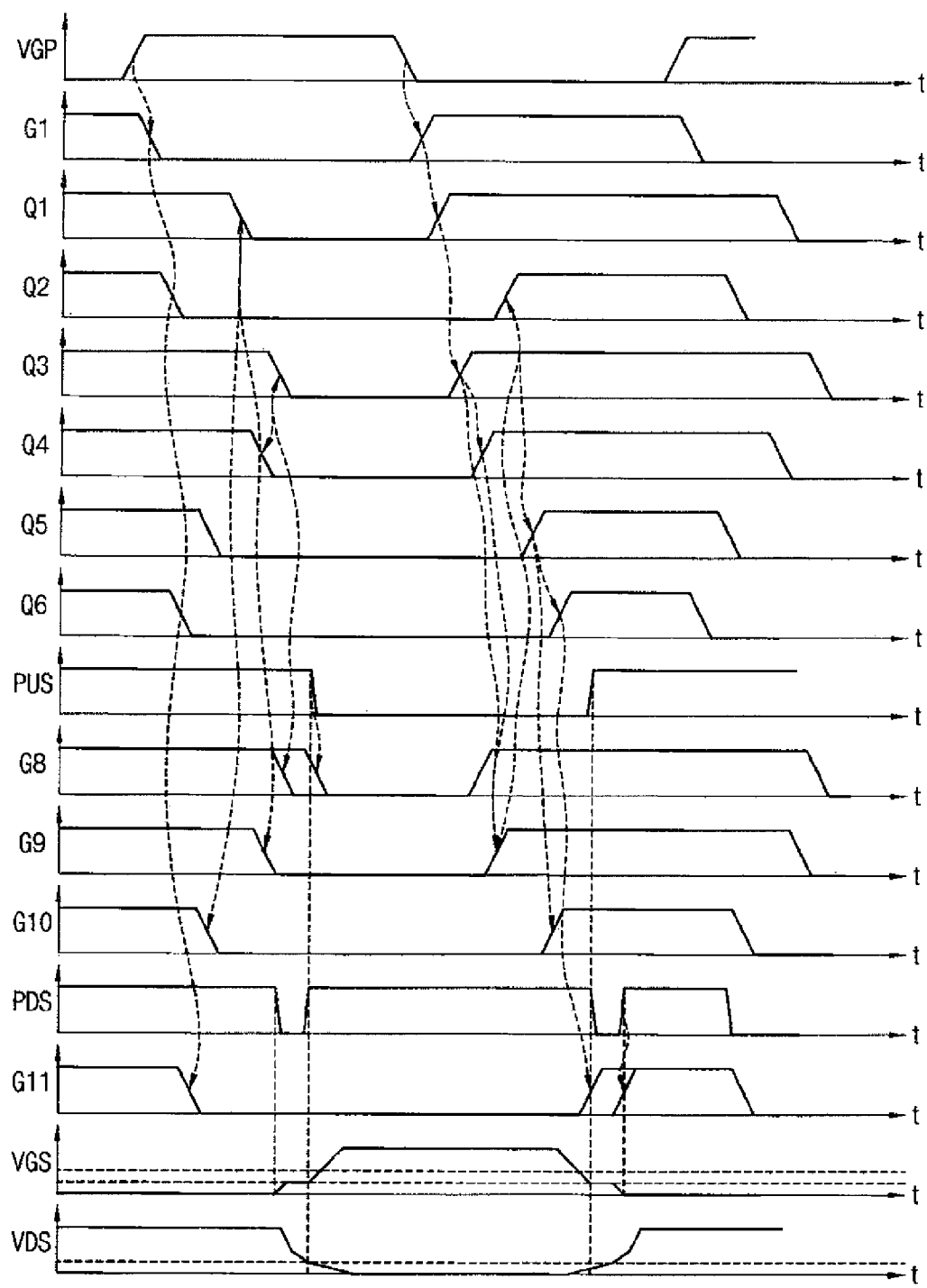
FIG. 5 is a view showing exemplary waveforms for explaining exemplary operations of the circuits shown FIGS. 3 and 4 according to exemplary embodiments of the inventive concept.

FIG. 5 is a view showing exemplary waveforms for explaining exemplary operations of the circuits shown FIGS. 3 and 4 according to exemplary embodiments of the inventive concept.

Referring to FIG. 5, if the gate driving pulse VGP is transitioned from the low state to the high state, the falling transitions occur through the inverter G1 in the sequence of the second output signal Q2 of the input latch 132, and the second output signal Q6 and the first output signal Q5 of the pull-down latch 124. The pull-down transistor PDM2 is primarily turned off due to the rising transition of the second output signal Q6 and then the pull-down transistor PDM1 is turned off. After the pull-down transistors PDM1 and PDM2 are turned off, the falling transitions occur in the sequence of the first output signal Q1 of the input latch 132, and the second output signal Q4 and the first output signal Q3 of the pull-up latch 114. The pull-up transistor PUM1 is primarily turned on due to the falling transition of the second output signal Q. Then, the gate source voltage VGS starts to rise and the drain source voltage VDS starts to fall. Although the pull-up transistor PUM2 has to be turned on due to the falling transition of the first output signal Q3, since the first detection signal PUS having the high state is applied to the OR gate G8, the time point of turning on the pull-up transistor PUM2 is delayed. Since the pull-up current driving ability is limited by the size of the pull-up transistor PUM1 unless the drain source voltage VGS falls equal to or less than the threshold voltage VTH3, the slope is smoothly maintained.

If the drain source voltage VGS falls equal to or less than the threshold voltage VTH3, the first detection signal PUS is transitioned to the logic low state, so the pull-up transistor PUM2 is turned on. If the pull-up transistor PUM2 is turned on, the gate pull-up current driving ability of the power MOS transistor MOSFET1 is maximized to rapidly increase the drain source voltage VGS. Thus, the conduction loss caused by "On Resistance" (Ron) is minimized.

If the gate driving pulse VGP is transitioned from the high state to the low state, the rising transitions occur through the inverter G1 in the sequence of the first output signal Q1 of the input latch 132, and the first output signal Q3 and the second output signal Q4 of the pull-up latch 114. After that, the pull-up transistor PUM2 is primarily turned off and then the pull-up transistor PUM1 is turned off. After the pull-up transistors PUM1 and PUM2 are turned off, the rising transitions occur in the sequence of the second output signal Q2 of the input latch 132, and the first output signal Q5 and the second output signal Q6 of the pull-down latch 124. The pull-down transistor PDM1 is primarily turned on through the buffer G10 due to the rising transition of the first output signal Q5.

If the gate source voltage VGS falls equal to or less than the first set voltage of VTH4+VTH_NM1 as the pull-down transistor M1 is turned on, the detection signal PDS is transitioned from the high state to the low state.

Therefore, in spite of the rising transition of the second output signal Q6, the output of the AND gate G11 is maintained. Thus, the pull-down current driving ability is limited by the pull-down transistor PDM1, so that the slope is sluggishly maintained.

Since the detection signal PDS is transitioned to the high state when the gate source voltage falls equal to or less than the threshold voltage VTH5, the output of the AND gate G11 is transitioned to the high state. Thus, if the pull-down transistor PDM2 is turned on, the power MOS transistor MOSFET1 is driven to be pulled down with the maximum pull-down current driving ability. Thus, in a Discontinuous conduction Mode (DCM), the power MOS transistor MOSFET1 may be prevented from being turned on due to noise.

Figure 6:
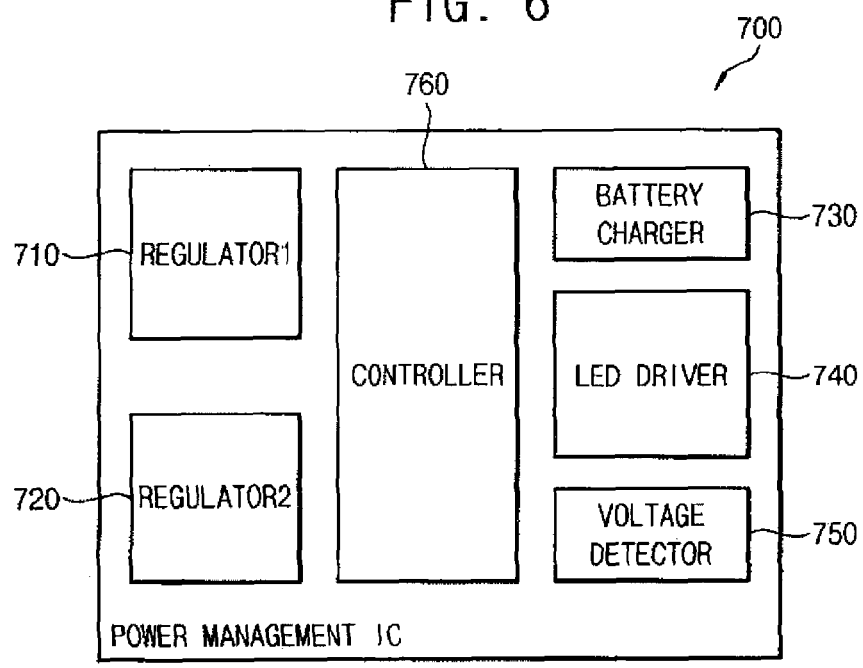
FIG. 6 is a block diagram of a power management IC including the DC-DC converter 10 in FIG. 1 according to an exemplary embodiment of the inventive concept.

FIG. 6 is a block diagram of a power management IC including the DC-DC converter in FIG. 1 according to an exemplary embodiment of the inventive concept.

Referring to FIG. 6, the power management IC 700 is an integrated circuit for managing electric power. The power management IC 700 is used for electronic devices such as a mobile phone, a PMP (Portable Multimedia Player), etc.

The power management IC 700 includes at least one regulator (for example, 710, or 720). The regulator(s) 710 and/or 720 provide power to components of an electronic device (not shown). The regulator(s) 710 and/or 720 include the DC-DC converter of FIG. 1. The regulator 710 may be a linear regulator and the regulator 720 may be a DC-DC converter including the adaptive gate driving circuit 100.

According to an exemplary embodiment of the inventive concept, the power management IC 700 includes various components. For example, the power management IC 700 may include a battery charger 730, an LED driver 740, a voltage detector 750, or a controller 760.

The battery charger 730 may charge a battery (not shown) under the control of the controller 760. The LED driver 740 may operate an LED of the electronic device under the control of the controller 760. The voltage detector 750 is a sensor capable of detecting a voltage of the electronic device. The controller 760 may further control an operation of the regulator(s) 710 and/or 720.

Figure 7:
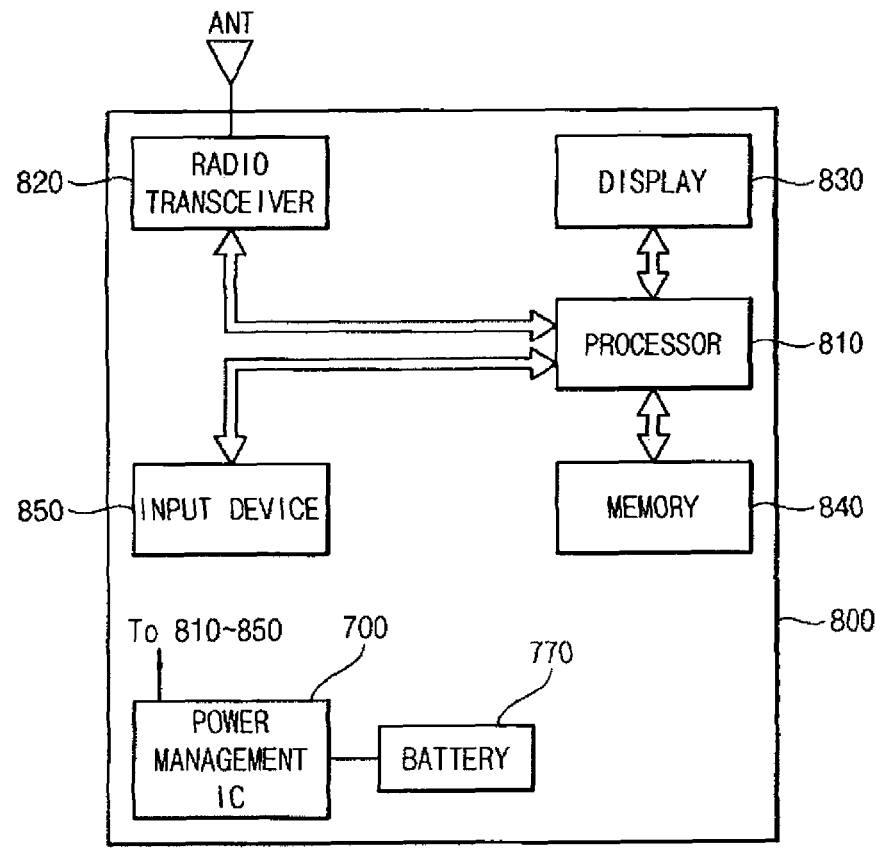
FIG. 7 is an exemplary embodiment of an electronic device including the DC-DC converter in FIG. 1.

FIG. 7 is an exemplary embodiment of an electronic device including the DC-DC converter in FIG. 1.

The electronic device 800, for example, a cellular phone, smart phone, or tablet PC, includes the power management IC 700 and a battery 770. The power management IC 700 is provided power from the battery 770 and is configured to manage power of a processor 810, a wireless transmitter-receiver 820, a display 830, a memory 840, or an input device 850. The power management IC 700 includes the DC-DC converter 10 of FIG. 1.

The wireless transmitter-receiver 820 may transmit or receive a radio signal through an antenna ANT. For example, the wireless transmitter-receiver 820 may convert the radio signal received through the antenna ANT into a signal that the processor 810 may process. Accordingly, the processor 810 may process the signal output from the wireless transmitter-receiver 820 and store the processed signal to the memory 840 or display the processed signal through the display 830. The wireless transmitter-receiver 820 may convert the signal output from the processor 810 into a radio signal and output the converted radio signal to the outside through the antenna ANT.

The input device 850 is a device capable of inputting a control signal for controlling an operation of the processor 810 or data to be processed by the processor 810, and may be implemented as a pointing device such as a touch pad or computer mouse, a keypad, or a keyboard.

The processor 810 may control the display 830 to display a data output from the memory 840, a radio signal output from the wireless transmitter-receiver 820, or a data output from the input device 850.

Figure 8:
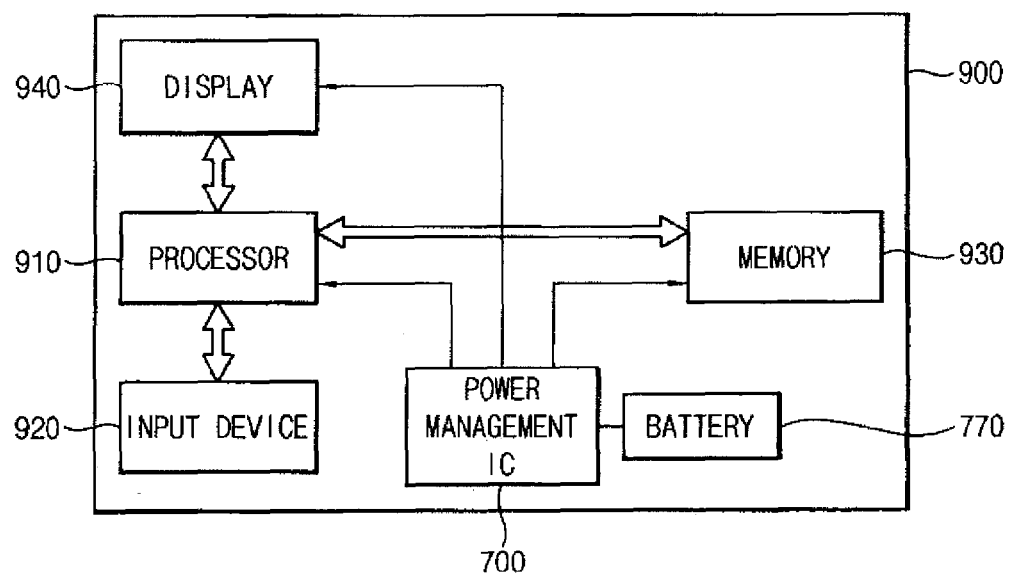
FIG. 8 is a block diagram illustrating an exemplary embodiment of an electronic device including the DC-DC converter 10 in FIG. 1.

FIG. 8 is a block diagram illustrating an exemplary embodiment of an electronic device including the DC-DC converter 10 in FIG. 1.

Referring to FIG. 8, an electronic device 900 may be implemented as a PC (Personal Computer), tablet computer, netbook, e-reader, PDA (Personal Digital Assistant), PMP (Portable Multimedia Player), MP3 player, or MP4 player, and the electronic device 900 includes a power management IC 700 and a battery 770.

The power management IC 700 is provided power from the battery 770 and may manage power of a processor 910, an input device 920, a memory 930, or a display 940. The power management IC 700 includes the DC-DC converter 10 in FIG. 1.

The electronic device 900 may include the processor 910 to control the general operation of the electronic device 900. The processor 910 may display data stored to the memory 930 according to an input signal generated from the input device 920 through the display 940. For example, the input device 920 may be implemented as a pointing device such as touch pad or computer mouse, a keypad, or a keyboard.

Figure 9:
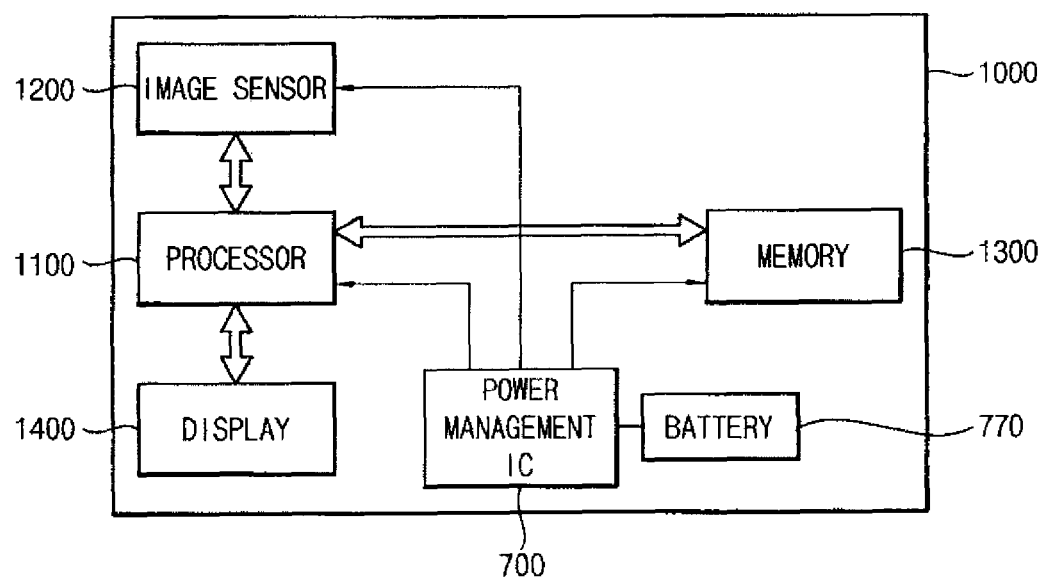
FIG. 9 illustrates an exemplary embodiment of an electronic device including a soft start circuit shown in FIG. 1.

FIG. 9 illustrates an exemplary embodiment of an electronic device including a soft start circuit shown in FIG. 1.

Referring to FIG. 9, the electronic device 1000 may be implemented as a digital camera and includes a power management IC 700 and a battery 770.

The power management IC 700 is provided power from the battery 770 and may manage power of a processor 1100, an image sensor 1200, a memory 1300, or a display 1400. The power management IC 700 includes the DC-DC converter 10 in FIG. 1.

The image sensor 1200 of the electronic device 1000 may convert an optical signal into a digital signal, and the converted digital signal may be stored to the memory 1300 or displayed through the display 1400 under the control of the processor 1100. Also, the digital signal stored to the memory 1300 may be displayed through the display 1400 under the control of the processor 1100.

As described above, although a gate driving circuit according to an exemplary embodiment of the inventive concept is described with reference to the N-type power MOSFET1, the adaptive gate driving may also be applied to a P-type power MOSFET.

According to at least one exemplary embodiment of the inventive concept, the slope of a voltage of a power MOSFET can be adaptively controlled regardless of the CGD of the power MOSFET, so the RON of the power MOSFET may be maintained. Thus, the errors in the DCM can be prevented when the power MOSFET is turned off, and the EMI may be reduced by delaying the slope.

The foregoing is illustrative of exemplary embodiments of the inventive concept and is not to be construed as limiting thereof. Although a few exemplary embodiments have been described, many modifications are possible in the exemplary embodiments without materially departing from the present inventive concepts.

What is claimed is:

1. A circuit for driving a gate of a power metal oxide semiconductor MOS transistor, the circuit comprising:
   an adaptive pull-up unit connected between a first power source voltage and the gate of the power MOS transistor, the adaptive pull-up unit configured to maximize pull-up current driving ability when a drain-source voltage of the power MOS transistor falls equal to or less than a threshold voltage of the power MOS transistor while a falling transition slope of the power MOS transistor is being driven in a multistage scheme by increasing the pull-up current driving ability stepwisely in response to a leading edge of a gate driving pulse; and
   an adaptive pull-down unit connected between a second power source voltage and the gate of the power MOS transistor, the adaptive pull-down unit configured to maximize pull-down current driving ability when a gate source voltage of the power MOS transistor falls equal to or less than the threshold voltage of the power MOS transistor while a rising transition slope of the power MOS transistor is being driven in a multistage scheme by increasing the pull-down current driving ability stepwisely in response to a trailing edge of the gate driving pulse.

2. The circuit of claim 1, wherein the adaptive pull-up unit comprises a plurality of pull-up transistors connected in parallel between the first power source voltage and the gate of the power MOS transistor;
   a drain-source voltage detecting unit configured to detect whether a level of the drain-source voltage of the power MOS transistor falls equal to or less than the threshold voltage of the power MOS transistor;
   a pull-up driving signal generating unit configured to generate a plurality of pull-up driving signals to drive the pull-up transistors stepwisely in response to the leading edge of the gate driving pulse; and
   a gate unit configured to drive a pull-up transistor of a last stage from among the pull-up transistors selectively in response to a pull-up driving signal of the last stage from among the pull-up driving signals and a detection signal from the drain source voltage detecting unit.

3. The circuit of claim 2, wherein the drain source voltage detecting unit comprises:
   a first MOS transistor that has a gate coupled to the first power source voltage and a drain coupled to a drain of the power MOS transistor;
   a second MOS transistor that has a gate coupled to the source of the first MOS transistor and a source coupled to the second power source voltage;
   a first current source connected between the first power source voltage and a drain of the second MOS transistor; and
   a CMOS inverter that outputs a drain voltage of the second MOS transistor as the detection signal of a CMOS level.

4. The circuit of claim 3, wherein the first and second MOS transistors comprise Lateral Double Diffuse LD MOS transistors that have a threshold voltage equal to a threshold voltage of the power MOS transistor.

5. The circuit of claim 1, wherein the adaptive pull-down unit comprises:
   a plurality of pull-down transistors connected in parallel between the second power source voltage and the gate of the power MOS transistor;
   a gate-source voltage detecting unit configured to detect whether a level of a gate-source voltage of the power MOS transistor is between a Miller Plateau voltage level of the power MOS transistor and a level of the threshold voltage;
   a pull-down driving signal generating unit configured to generate a plurality of pull-down driving signals for driving the pull-down transistors step by step in response to the trailing edge of the gate driving pulse; and
   a gate unit configured to mask a pull-down driving signal of a last stage among the pull-down driving signals such that the pull-down driving signal is prevented from being applied to a pull-down transistor of the last stage among the pull-down transistors unless the gate source voltage of the power MOS transistor falls equal to or less than the threshold voltage of the power MOS transistor in response to the detection signal of the gate-source voltage detecting unit.

6. The circuit of claim 5, wherein the gate-source voltage detecting unit comprises:

a first voltage comparing unit configured to detect whether the gate source voltage of the power MOS transistor falls equal to or less than a first preset voltage;

a second voltage comparing unit configured to detect whether the gate source voltage of the power MOS transistor falls equal to or less than the threshold voltage; and a masking signal generating unit configured to generate a masking control signal by combining outputs of the first and second voltage comparing units with each other.

7. The circuit of claim 6, wherein the first voltage comparing unit comprises:

a first MOS transistor that has a gate coupled to the gate of the power MOS transistor;

a first current source connected between the first power source voltage and a drain of the first MOS transistor;

a second MOS transistor that has a gate and a drain coupled to a source of the first MOS transistor and a source coupled to the second power source voltage;

a third MOS transistor that has a gate coupled to the drain of the first MOS transistor and a source coupled to the first power source voltage;

a second current source connected between a drain of the third MOS transistor and the second power source voltage; and a CMOS inverter that outputs a drain voltage of the second MOS transistor as the detection signal of a CMOS level.

8. The circuit of claim 7, wherein the second voltage comparing unit comprises:

a fourth MOS transistor that has a gate coupled to the gate of the power MOS transistor;

a third current source connected between the first power source voltage and a drain of the fourth MOS transistor;

a fifth MOS transistor that has a gate coupled to the drain of the fourth MOS transistor and a source coupled to the first power source voltage; and a fourth current source connected between a drain of the fifth MOS transistor and the second power source voltage.

9. The circuit of claim 8, wherein the masking signal generating unit comprises an XOR gate to which an output of the CMOS inverter of the first voltage detecting unit and a drain output of the fifth MOS transistor of the second voltage comparing unit are input.

10. The circuit of claim 8, wherein the first and fourth MOS transistors comprise LD MOS transistors that have a threshold voltage equal to the threshold voltage of the power MOS transistor.

11. A circuit for driving a gate of a power metal oxide semiconductor MOS transistor, the circuit comprising:

a pair of pull-up transistors connected in parallel between a first power source voltage and the gate of the power MOS transistor;

a pair of pull-down transistors connected in parallel between a second power source voltage and the gate of the power MOS transistor;

a drain-source voltage detecting unit configured to detect whether a level of a drain source voltage of the power MOS transistor falls equal to or less than the threshold voltage of the power MOS transistor;

a gate-source voltage detecting unit configured to detect whether a level of a gate source voltage of the power MOS transistor is between a Miller Plateau voltage level of the power MOS transistor and a level of the threshold voltage;

a driving signal generating unit configured to generate a pair of pull-up and pull-down driving signals to drive the pair of pull-up and pull-down transistors step by step according to a gate driving pulse;

a pull-up gate unit configured to drive one of the pair of pull-up transistors, which is turned on later than a remaining pull-up transistor, selectively in response to one of the pair of pull-up driving signals being activated later than a remaining pull-up driving signal and a detection signal of the drain source voltage detecting unit; and a pull-down gate unit configured to mask one of the pair of the pull-down driving signals activated later than a remaining pull-down driving signal such that the pull-down driving signal is prevented from being applied to one of the pair of the pull-down transistors turned on later than a remaining pull-down transistor unless the gate source voltage of the power MOS transistor falls equal to or less than the threshold voltage of the power MOS transistor in response to a detection signal of the gate source voltage detecting unit.

12. The circuit of claim 11, wherein the driving signal generating unit comprises:

an input latch configured to generate a first output and a second output, in which the first output is subject to a falling transition after the second output is primarily subject to the falling transition and the pull-down transistors are turned off in response to a rising transition of the gate driving pulse, and the second output is subject to the rising transition after the first output is primarily subject to the rising transition and the pull-up transistors are turned off in response to the falling transition of the gate driving pulse;

a pull-up latch configured to generate a first output and a second output, in which the second output of the pull-up latch is subject to the falling transition prior to the first output of the pull-up latch when the falling transition occurs and the first output of the pull-up latch is subject to the rising transition prior to the second output of the pull-up latch when the rising transition occurs in response to the first output of the input latch; and a pull-down latch configured to generate a first output and a second output, in which the second output of the pull-down latch is subject to the falling transition prior to the first output of the pull-down latch when the falling transition occurs and the first output of the pull-down latch is subject to the rising transition prior to the second output of the pull-down latch when the rising transition occurs in response to the second output of the input latch, wherein the second output of the pull-up latch is provided as a gate driving signal for one of the pair of the pull-up transistors, wherein the first output of the pull-up latch is provided through the pull-up gate unit as a gate driving signal for a remaining one of the pull-up transistors, wherein the first output of the pull-down latch is provided as a gate driving signal for one of the pair of the pull-down transistors, and wherein the second output of the pull-down latch is provided as a gate driving signal for a remaining one of the pull-down transistors.

13. The circuit of claim 12, wherein the pull-up gate unit comprises an OR gate, and the pull-down gate unit comprises an AND gate.

14. A DC-DC converter comprising a power metal oxide semiconductor MOS transistor, the converter comprising:

a pair of pull-up transistors connected in parallel between a first power source voltage and a gate of the power MOS transistor;

a pair of pull-down transistors connected in parallel between a second power source voltage and the gate of the power MOS transistor;

a drain-source voltage detecting unit configured to detect whether a level of a drain source voltage of the power MOS transistor falls equal to or less than the threshold voltage of the power MOS transistor;

a gate-source voltage detecting unit configured to detect whether a level of a gate source voltage of the power MOS transistor is between a Miller Plateau voltage level of the power MOS transistor and a level of the threshold voltage;

a circuit configured to provide first though fourth signals according to a gate driving pulse;

a first logic gate configured to receive an output of the drain-source voltage detecting unit and the first signal as input and provide an output to a gate of one of the pull-up transistors;

a first buffer configured to provide the second signal to a gate of the other pull-up transistor;

a second buffer configured to provide the third signal to a gate of one of the pull-down transistors; and a second logic gate configured to receive an output of the gate-source voltage detecting unit and the fourth signal as input and provide and output to a gate of the other pull-down transistor.

15. The DC-DC converter of claim 14, further comprising:
a first capacitor connected between a DC input voltage and the second power source voltage;

an inductor connected between the first capacitor and a drain of the power MOS transistor;

a diode connected between the inductor and the drain of the power MOS transistor; and a second capacitor connected between the diode and the second power source voltage, wherein an output node between the diode and the second capacitor outputs a DC output voltage.

16. The DC-DC converter of claim 14, wherein the first signal is provided to a last one of the pull-up transistors, and the fourth signal is provided to a last one of the pull-down transistors.

17. The DC-DC converter of claim 14, wherein the first logic gate is an OR gate and the second logic gate is an AND gate.

18. The DC-DC converter of claim 14, wherein the circuit comprises:
a first OR gate configured to receive a signal based on the gate driving pulse;

a second OR gate configured to receive an output of the first OR gate and provide an output to the first logic gate; and a first AND gate configured to receive an output of the first OR gate and provide an output to the first buffer.

19. The DC-DC converter of claim 18, wherein the circuit further comprises:
a second AND gate configured to receive the signal based on the gate driving pulse;

a third OR gate configured to receive an output of the second AND gate and providing an output to the second buffer; and a third AND gate configured to receive an output of the second AND gate and provide an output to the second logic gate.

20. The DC-DC converter of claim 19, wherein an output of the second OR gate is provided to an input of the first AND gate, an output of the first AND gate is provided to an input of the second OR gate, wherein an output of the third OR gate is provided to an input of the third AND gate, and an output of the third AND gate is provided to an input of the third OR gate.

* * * * *